(12) United States Patent
De Fazio et al.

(10) Patent No.: US 11,428,717 B2
(45) Date of Patent: Aug. 30, 2022

(54) CURRENT MEASUREMENT CIRCUIT

(71) Applicant: Apple Inc., Cupertino, CA (US)

(72) Inventors: Michele De Fazio, Germering (DE); Shawn Searles, Austin, TX (US)

(73) Assignee: Apple Inc., Cupertino, CA (US)

( * ) Notice: Subject to any disclaimer, the term of this patent is extended or adjusted under 35 U.S.C. 154(b) by 39 days.

(21) Appl. No.: 17/033,505

(22) Filed: Sep. 25, 2020

(65) Prior Publication Data
US 2022/0099712 A1 Mar. 31, 2022

(51) Int. Cl.
G01R 19/15 (2006.01)
G01R 19/257 (2006.01)

(52) U.S. Cl.
CPC ........... *G01R 19/15* (2013.01); *G01R 19/257* (2013.01)

(58) Field of Classification Search
None
See application file for complete search history.

(56) References Cited

U.S. PATENT DOCUMENTS

| 8,330,435 | B2 | 12/2012 | Qiu et al. | |
| 9,350,243 | B2 | 5/2016 | Chen et al. | |
| 2013/0154507 | A1* | 6/2013 | Gilliom | H05B 45/3725 315/297 |
| 2020/0169187 | A1 | 5/2020 | Kobayashi et al. | |
| 2021/0159788 | A1* | 5/2021 | Kasturi | G01R 19/2509 |

FOREIGN PATENT DOCUMENTS

EP 2393195 A2 12/2011

* cited by examiner

*Primary Examiner* — Daniel C Puentes
(74) *Attorney, Agent, or Firm* — Kowert, Hood, Munyon, Rankin & Goetzel, P.C.; Erik A. Heter; Dean M. Munyon

(57) ABSTRACT

A current measurement circuit is disclosed. The current measurement circuit includes first and second circuit branches coupled to a circuit node through which current is to be measured. During a first period, the first circuit branch converts the current into a first voltage. During a second period, the second circuit branch converter the current into a second voltage. An analog-to-digital converter is configured to convert the first and second voltages into digital values indicative of the measured current. A control circuit is configured to alternately select one of the first and second branches during the generation of the digital values.

20 Claims, 7 Drawing Sheets

CURRENT MEASUREMENT CIRCUIT

BACKGROUND

Technical Field

This disclosure is directed to electronic circuits, and more particularly, to circuits for measuring currents.

Description of the Related Art

In many electronic circuits, various forms of measurement may be provided. For example, electrical parameters such as voltage and current may be measured during operation for various reasons, such as controlling workloads, ensuring that circuits are operating within specified limits, and so forth. In a more specific example, output current from a voltage regulator may be measured in some cases as part of a control loop. Using the measured current in a control loop may, e.g., allow tracking of the energy usage by the load circuit over time, among other possible uses.

SUMMARY

A current measurement circuit is disclosed. In one embodiment, a current measurement circuit includes first and second circuit branches coupled to a circuit node through which current is to be measured. During a first period, the first circuit branch converts the current into a first voltage. During a second period, the second circuit branch converter the current into a second voltage. An analog-to-digital converter (ADC) is configured to convert the first and second voltages into corresponding digital values indicative of the measured current. A control circuit is configured to alternately select one of the first and second branches during the generation of the digital values.

The current measurement circuit may be used in a variety of applications. In one embodiment, the current measurement circuit may be coupled to, e.g., an output node of a switching power converter (e.g., a buck converter). The first circuit branch may include a first capacitor that may be coupled to the output node by the closing of a first switch. Similarly, the second circuit branch may be coupled to the output node by the closing of a second switch. During the first period, the control circuit may couple the first capacitor to the output node, with the first capacitor accumulating charge and thus generating a first voltage. During the second period, the control circuit may couple the second capacitor to the output node, with the second capacitor accumulating charge and therefore generating a second voltage. The first and second voltages are converted by the ADC into digital values, which may be stored in a digital storage circuit. For some specified duration, the accumulated digital values can be used to determine the average current through the output node.

In one embodiment, the ADC may receive the first voltage via a switch during the first period, and the second voltage via another switch during the second period. In another embodiment, the ADC may be implemented by corresponding comparators coupled to the first and second branches. The assertion of an output signal by one of these comparators causes the other branch to be selected, and increments a count value that can, over a certain time, indicate the average current.

BRIEF DESCRIPTION OF THE DRAWINGS

The following detailed description makes reference to the accompanying drawings, which are now briefly described.

DETAILED DESCRIPTION OF EMBODIMENTS

Various embodiments of a current measurement circuit are disclosed. The current measurement circuit may be used with, e.g., a power converter (e.g., a boost or buck regulator), although it may be used in other applications as well.

Measuring current in, e.g., integrated circuits, often includes converting the measured current into a digital value representative thereof. However, analog-to-digital converters (ADCs) may be limited in their respective conversion speeds. This in turn may limit the granularity with which current can be measured in an IC. In some applications, the inability to rapidly and accurately convert a current into a digital value may prevent the implementation of some desired functionality, such as tracking output current of a power converter such as a buck or boost converter.

The present disclosure is directed to various embodiments of a current measurement circuit that may allow for fast and accurate current measurement within the limits of various types of ADCs. The current measurement circuits disclosed herein utilize analog accumulation of charge, which can be converted into a voltage. The voltage on a particular branch may be used in generation of digital values indicative of a measured current.

In various embodiments, a circuit branch of the current measurement circuit may include a capacitor that can be coupled to a current node (wherein the current node is defined herein as a node through which the current to be measured flows). The capacitor may charge for a time (which may be fixed in some embodiments, variable in others). The voltage on the capacitor may then be provided to an ADC circuit for used in generating digital values indicative of the current. Embodiments are contemplated herein that include, e.g., two circuit branches that are alternately selected to charge for providing a voltage to the ADC circuit. By using the analog accumulation methodology as disclosed herein, the voltages accumulated can be converted to produce digital values that represent an average amount of current over a particular interval. In some embodiments, this may allow more accurate measurement of currents than would be possible than by directly providing the current to an input of an ADC, particularly with larger loads. Various embodiments of the current measurement circuit is now discussed in further detail below.

Figure 1:
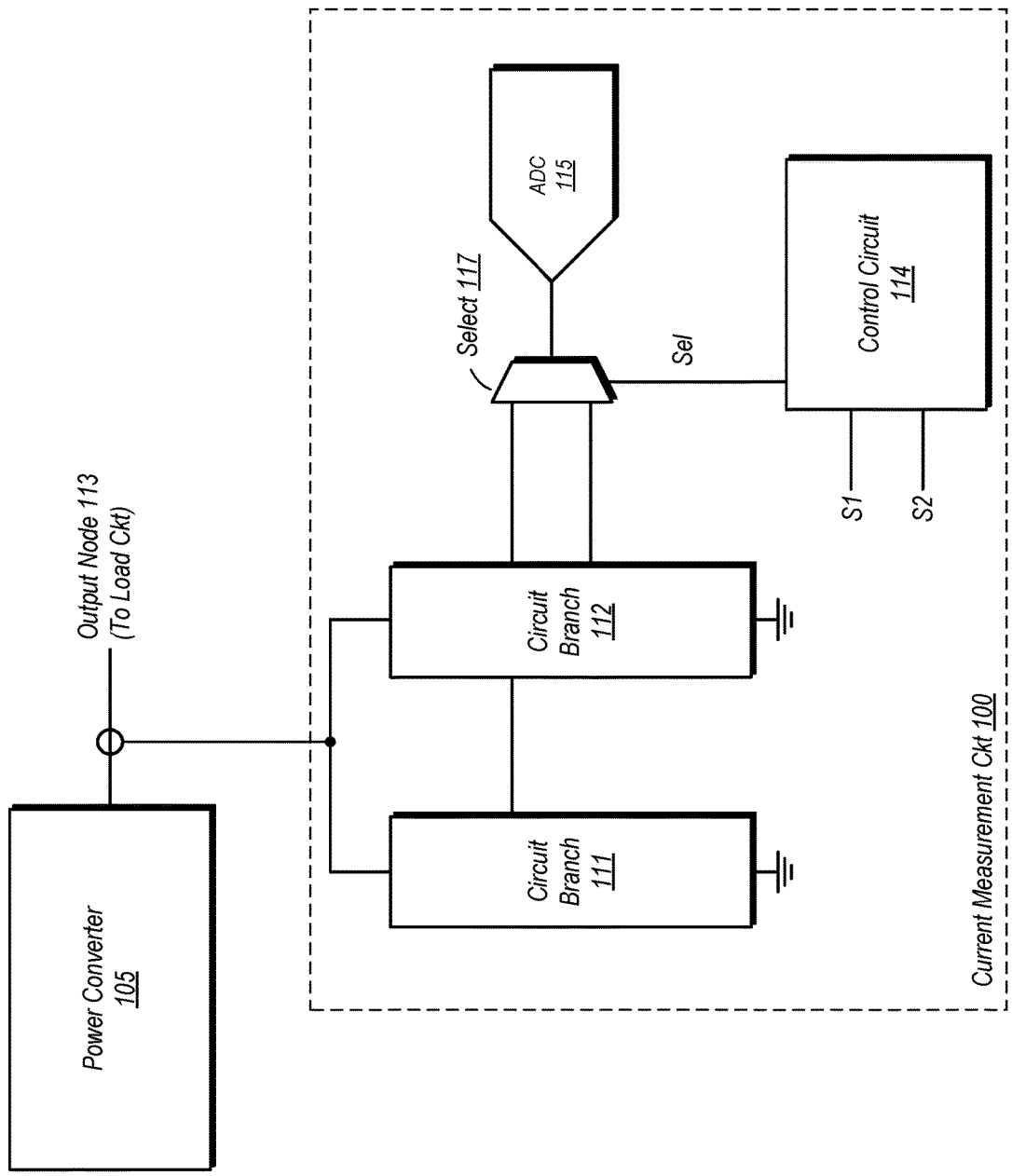
FIG. 1 is a block diagram of one embodiment of a current measurement circuit coupled to measure a current from a power converter.

FIG. 1 is a block diagram of one embodiment of a current measurement circuit coupled to measure a current from a power converter. In the embodiment shown, current measurement circuit 100 is coupled to measure the current on output node 113 of a power converter 105. The power converter 105 may be any type of power conversion circuits, such as a boost converter, a buck converter, a low dropout (LDO) voltage regulator, and so on. It is noted that while the current measurement in this example is performed on the output node of power converter 105, current measurement circuit 100 may be used to measure current on virtually any type of circuit and at virtually any node of a given circuit.

Current measurement circuit 100 in the embodiment shown includes two circuit branches coupled to output node 113, circuit branch 111 and circuit branch 112. Each of circuit branches 111 and 112 in the embodiment shown is configured to convert current from output node 113 into respective voltages. In the embodiment shown, under the control of control circuit 114, the circuit branches 111 and 112 may operate in an alternating fashion. During a first period, circuit branch 111 may convert current measured on output node 113 into a first voltage. During a second period, circuit branch 112 may convert current measured on output node 113 into a second voltage. These first and second voltages may be provided, via a selection circuit 117, to ADC 115. Accordingly, the voltages from first and second branches 111 and 112 are used to generate digital values indicative of measured current.

Control circuit 114 may alternately couple the first and second branches to output node 113 in an alternating fashion. Similarly, control circuit 114 may alternatively couple circuit branches 111 and 112 to ADC 115. In this particular example, control circuit 114 may toggle a select signal, Sel, to select circuit 117.

The selection of circuit branches 111 and 112 and conversion of voltages into digital values may vary from one embodiment to the next, with different embodiments to be discussed in further detail below. In one embodiment, each of circuit branches 111 and 112 may be coupled to output node 113 (or more generally, a circuit node through which current is to be measured) during their respective periods for a fixed amount of time, while the voltages generated thereby may be variable. A voltage generated by a particular one of circuit branches 111 and 112 may be provided to ADC 115 while the other circuit branch is coupled to output node 113 to generate its respective voltage. For example, circuit branch 111 may be coupled to output node 113 to generate the first voltage during a first period of a number of repeating cycles. During the first period, circuit branch 112 may be coupled to provide a second voltage generated during a previous cycle to ADC 115 via selection circuit 117. During the second period, circuit branch 112 is coupled to output node 113 to generate the second voltage, while the first voltage from circuit branch 111 is provided to ADC 115 via selection circuit 117. After the voltages from the respective circuit branches have been provided to ADC 115 for a sufficient amount of time for conversion, the respective circuit legs may undergo a discharge cycle before their next period of converting the measured current into a voltage. Current measurement circuit 100 in such an embodiment may operate over a number of repeating cycles of this type of operation.

In another embodiment, the time at which each of circuit branches 111 and 112 are coupled to output node 113 (or more generally, a circuit node through which current is to be measured) may be variable, while the voltages generated on each branch are substantially fixed in value. In this embodiment, ADC 115 may include first and second comparators coupled to circuit branches 111 and 112, respectively, and a counter configured to generate the digital values that correspond to measured currents. Each of the comparators may include and input coupled to receive a reference voltage that is common to both. When a particular one of the circuit branches is selected, the voltage thereon may rise until the point it reaches a level equal to the reference voltage, causing the correspondingly coupled comparator to assert an output signal. Responsive to the assertion of the output signal by the comparator, the correspondingly coupled branch is de-selected and the other branch is selected. When the voltage provided from the newly selected branch reaches the reference voltage, it is de-selected and the other branch is selected. Each time the selected branch changes, a counter may be incremented. The incrementing may occur for a certain amount of time. After that time has elapsed, the counter value is output as a digital value indicative of the measured current.

It is noted that the various embodiments of a current measurement circuit 100 are discussed herein as having two circuit branches. However, embodiments with a different number of circuit branches are possible and contemplated. For example, embodiments with as few as one circuit branch, as well as three or more are possible and contemplated, in addition to the embodiments having two circuit branches as discussed herein.

Figure 2:
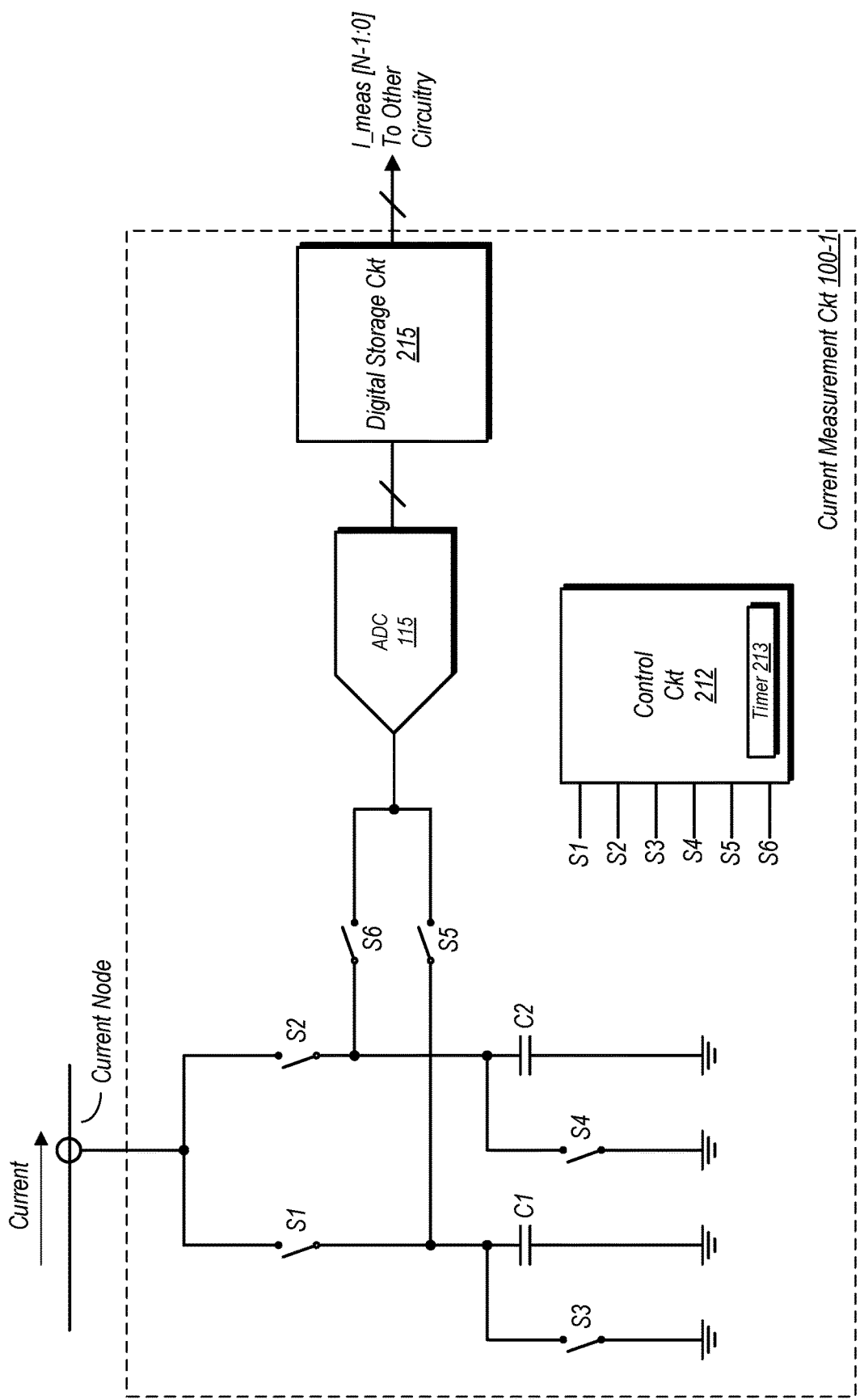
FIG. 2 is a schematic diagram of one embodiment of a current measurement circuit.

FIG. 2 is a schematic diagram of one embodiment of a current measurement circuit. In this particular embodiment, current measurement circuit 100-1 operates in manner in which the time that each circuit branch is coupled to ADC 115 for a fixed time, while the respective voltages conveyed to ADC 115 are variable.

Current measurement circuit 100-1 includes a first circuit branch having a capacitor C1 and a second current branch having a capacitor C2. Switches S1 and S2 are coupled to capacitors C1 and C2, respectively, and further coupled to a current node, which is defined herein as a node of a particular circuit through which the current is to be measured by current measurement circuit 100-1. Another switch, S3, is coupled in parallel between capacitor C1 and ground. Similarly, a switch S4 is coupled in parallel between capacitor C2 and ground. Switch S5 is coupled to the non-grounded terminal of C1, and further coupled to the input of ADC 115. Switch S6 is coupled between the non-grounded terminal of C2 and the input of ADC 115. Control circuit 212 in the embodiment shown is configured to generate and provide control signals to each of these switches, based in part on the operation of timer 213. Timer 213 may include one or more timing circuits that are used to control the respective durations that the various ones of switches S1-S6 are open and closed.

Current measurement circuit 100-1 also includes a digital storage circuit 215 which stores digital values received from ADC 115. Digital storage circuit 215 may be implemented using any suitable storage circuitry (e.g., random access memory, or RAM, flash, etc.). Digital values indicative of measured current values may be provided to other circuitry from digital storage circuit 215, e.g., as I_meas[N−1:0], an N bit digital value, as shown here. The other circuitry that may receive the digital values representative of the current may include, e.g., a power management unit that may perform control and/or evaluation functions using this information.

Current measurement circuit 100-1 may operate in a cyclical manner, with each cycle of this embodiment including a first period and a second period. During the first period, control circuit may close switch S1, while switch S2 is open. When switch S1 is closed, capacitor C1 is coupled to the current node and begins accumulating charge. This may continue for the entirety of the first period, with the voltage across C1 increasing as charge is accumulated. During an initial portion of the first period, switch S6 is closed and the voltage on capacitor C2 is sampled by ADC 115, with the correspondingly generated digital value conveyed to digital storage circuit 215 upon completing the sample. Switch S4 may be closed during a latter portion of the first period to discharge the voltage on C2.

At the end of the first period, switch S1 is open, while switches S2 and S5 are closed, thereby initiating the second period. The closing of switch S2 cause capacitor C2 to begin charging. The closing of switch S5 allows the voltage present on C1 to be conveyed to ADC 115, where it is sampled and converted into a digital value and subsequently stored in digital storage circuit 215. During the latter portion of the second period, switch S5 is opened and switch S3 is closed. The closing of switch S3 causes the voltage across C1 to be discharged to ground. Switch S2 remains closed during the entirety of the second period, accumulating charge and thus generating the voltage across C2. Upon completion of the second period, switch S2 is opened while switch S6 is closed to allow the voltage generated on C2 to be conveyed to ADC 115. Since the end of the second period coincides with the beginning of the first period of a next cycle, switch S3 is opened while switch S1 is closed.

Each voltage input into ADC 115 in the embodiment shown represents an average current measured over the period. A sudden spike or drop in the current within a period can have a significant effect on the rate of charging of a correspondingly coupled capacitor in one of the circuit branches, and thus a corresponding effect on the final sampled voltage. Thus, even though these current transients are not directly sampled by ADC 115, their occurrence may nevertheless be detected by being reflected in the voltage that is generated over the period and subsequently sampled. For example, if a sampled voltage for a given period is significantly higher than that of a previous period and a subsequent period, it is thus possible that a current spike occurred in the given period.

Generally speaking, current measurement circuit 100-1 may measure current in a circuit such as a buck converter with accuracy and in continuous time by measuring charge (in terms of voltage) over time. By alternating between the circuit branches in the illustrated embodiments, the analog accumulator (e.g., capacitors C1 and C2) may operate such that charge is accumulated without interruption, thereby allowing ADC 115 to operate correctly and within conversion speed limits.

As previously discussed, the embodiment shown in FIG. 2 allows charge measurement (analog accumulation) to be performed in a selected circuit branch according to the timing enforced by, e.g., timer 213, while the voltage on the capacitor of the other branch is sampled by ADC 115 and then subsequently reset (via discharging, as described above). This particular arrangement allows current measurement to continue while dealing with the latency of ADC 115 and the reset mechanism (switches S3 and S4). Accordingly, analog accumulation in the embodiment shown occurs in one circuit branch while digital conversion and capacitor reset occurs with respect to the other circuit branch.

Over a time T (e.g., where T is the time of a single period), the measured current can be calculated by the following equation:

$$I_{Measured} = I_{sense\_gain} \times ADC_{gain}\left(\frac{2}{T}\right) \times V_{ADC} \times C_{acc}, \quad \text{(Equation 1)}$$

where $I_{sense\_gain}$ is the ratio between the fraction of the current going into the respective branches of the circuit and the current at the output node of the power converter, $ADC_{gain}$ is the gain of the ADC, T is the time over which the average current is measured (e.g., a period within a cycle), $V_{ADC}$ is the voltage input into the ADC, and $C_{acc}$ is the capacitance of the capacitor upon which the charge is accumulated.

When used in a switching converter, the current sensing may be conducted over a full converter switching cycle or a half cycle, depending on the type and configuration of the converter, as well as on the particular current that is to be measured (e.g., converter output current). In switching converters, the current may be measured during a pulse frequency modulation (PFM) mode or a pulse width modulation (PWM) mode, without any transition error, and independent of the particular operating mode.

Figure 3:
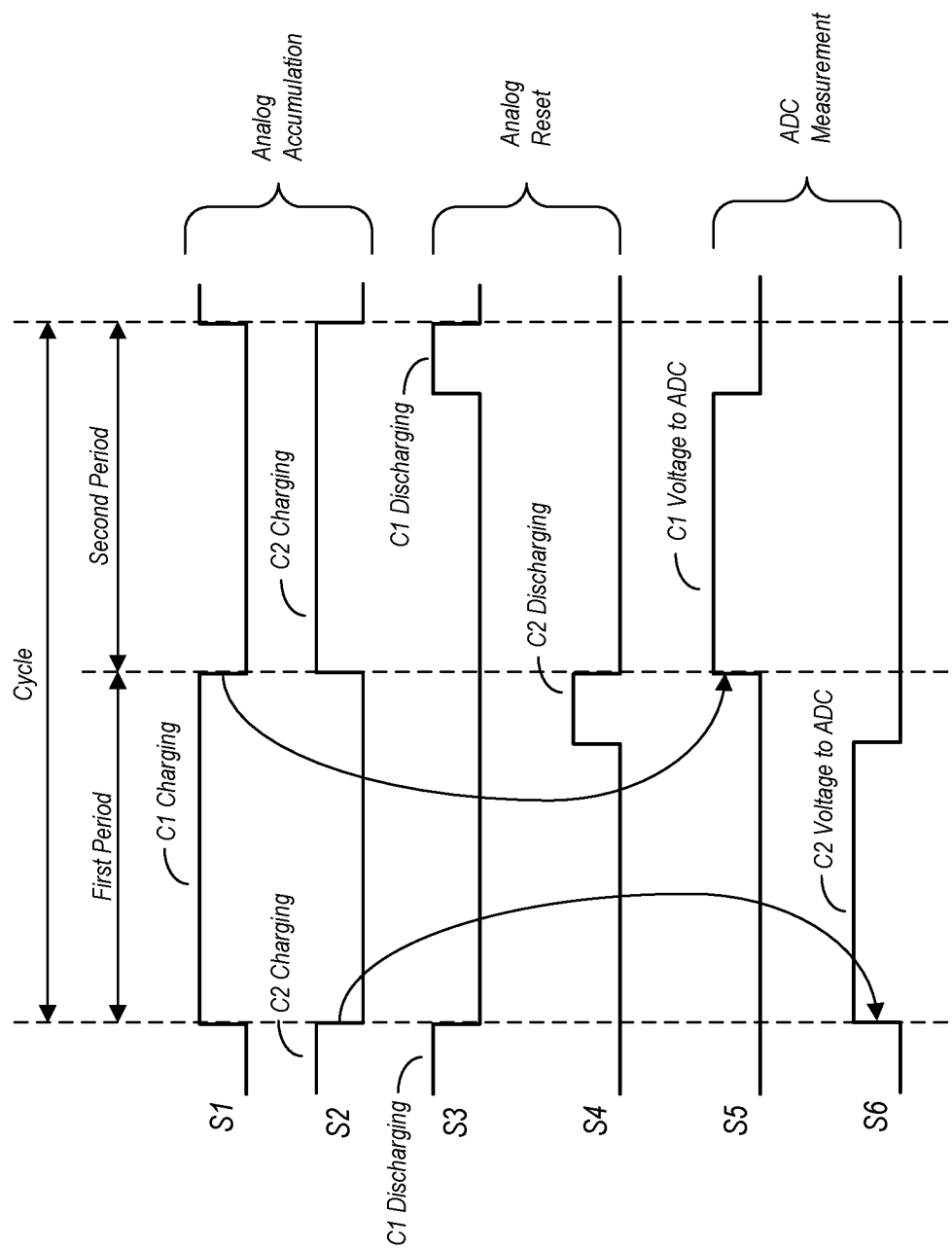
FIG. 3 is a timing diagram illustrating operation of one embodiment of a current measurement circuit.

FIG. 3 is a timing diagram illustrating operation of one embodiment of a current measurement circuit, and more particularly, the embodiment discussed above with reference to FIG. 2. In the example of FIG. 3, a full cycle is shown including both a first period and a second period. Where a logic high is shown, the corresponding switch can be considered closed for the purposes of this example. Similarly, for a logic low, the corresponding switch can be considered open.

At the beginning of the first period, switches S1 and S6 are closed. The closing of switch S1 couples capacitor C1 to the current node. Accordingly, capacitor C1 may begin accumulating charge, with the amount of accumulated charge being reflected in the voltage thereon. The closing of switch S6 coupled capacitor C2 to ADC 115, and thus the voltage thereon is provided for conversion into digital value. The digital value resulting from the conversion of the voltage on C2 is representative of an average current over the second period of the previous cycle. The beginning of the first period also coincides with the opening of switches S2 and S3. Opening S2 terminates the charging on capacitor C2. The opening of switch S3 terminates a reset/discharge of capacitor C1. Switches S4 and S5 are open at the beginning of the first period. Switch S5 remains open throughout the first period. Near the end of the first period, switch S4 closes, while switch S6 opens. The opening of switch S6 decouples capacitor C2 from ADC 115. The closing of switch S4 forms a path to ground in parallel with C2. With the parallel path active, the voltage on C2 is discharged to ground, thereby resetting its circuit branch.

At the end of the first period/beginning of the second period, switch S1 opens, thereby decoupling capacitor C1 from the current node. Meanwhile, switch S5 closes, thereby coupling C1 to ADC 115. The voltage on C5 is thus provided to ADC 115 for conversion into a digital value representative of the average current over the first period. Meanwhile, switch S4 opens to terminate the discharge of C2, while switch S2 closes and remains so for the entirety of the second period. Closing switch S2 couples capacitor C2 to the current node. Accordingly, C2 begins accumulating a charge, and thus a voltage. Switch S6 remains open during the entirety of the second period. Toward the end of the second period, switch S5 opens while switch S3 closes. Opening switch S5 decouples C1 from ADC 115. Meanwhile, closing switch S3 forms a path to ground in parallel with C1. Accordingly, C1 is discharged to ground during this time, effectively performing a reset of its respective circuit branch.

The cycle described above may repeat during operation of current measurement circuit 100-1, with the digital values generated during each period stored in digital storage circuit 215 and eventually forwarded to other circuitry for further processing.

Figure 4:
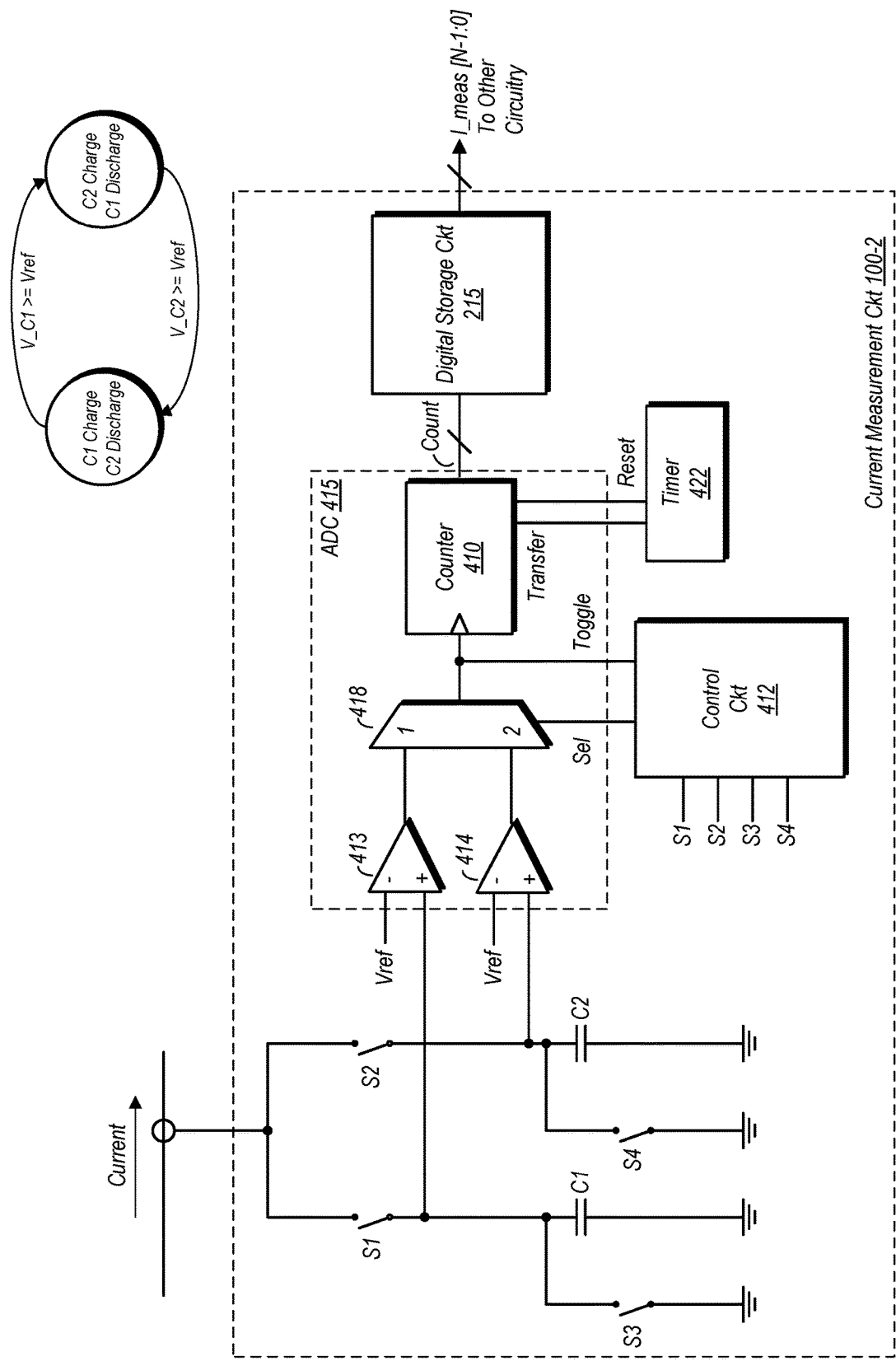
FIG. 4 is a schematic diagram of another embodiment of a current measurement circuit.

FIG. 4 is a schematic diagram of another embodiment of a current measurement circuit. In the embodiment shown, current measurement circuit 100-2 differs from the embodiment shown in FIG. 2 in the manner in which digital values are generated. In the embodiment of FIG. 2, the time of each period is fixed, while the charge/voltage accumulated on each capacitor may vary. In the embodiment shown in FIG. 4, the time of the first and second periods (and thus, overall cycle time), may vary in accordance with a rate at which the capacitors charge. The rate at which a given capacitor charges at any given time is dependent on the current through the current node. Meanwhile, the amount of accumulated charge, and thus the voltage accumulated on each of the capacitors is substantially fixed, limited by a reference voltage Vref.

As shown here, current measurement circuit 100-2 includes the first and second circuit branches having capacitors C1 and C2, respectively, along with the corresponding switches, in a configuration that is largely the same as that shown in FIG. 2. However, each of the circuit branches, and thus their respective capacitors, are coupled to a corresponding comparator. The first circuit branch, and thus C1, is coupled to the non-inverting input of comparator 413. The second circuit branch, and thus C2, is coupled to the non-inverting input of comparator 414. A common reference voltage, Vref, is coupled to the inverting input of each of comparators 413 and 414, and may be generated by any suitable voltage generation circuitry (e.g., a bandgap circuit). The output of comparators 413 and 414 are coupled to inputs of multiplexer 418. The output of multiplexer 418, a toggle signal ('Toggle') is provided to both a country 410 and to control circuit 412. The control circuit 412 provides control signals for each of the switches S1-S4, and also provides the select signal to multiplexer 418. The output of counter 410 is coupled to digital storage circuit 215, which may be any suitable circuitry for providing persistent storage of digital information.

During a first period, switch S1 is closed while switch S3 is open in the first circuit branch, while switch S2 is open while switch S4 is closed in the second circuit branch. Accordingly, during the first period, C1 is coupled to the current node, accumulating charge and thus, a voltage, while C2 is discharged to ground through the parallel current path formed by the closing of S4. During this time, C1 charges at a rate corresponding to the current through the current node. The charging of C1 continues until the voltage thereon reaches the level of Vref. Upon the voltage of C1 reaching the level of Vref, comparator 413 asserts an output signal which propagates through multiplexer 418 to cause assertion of the toggle signal. Assertion of the toggle signal has two effects. The first is to cause the incrementing of counter 410. The second is to cause control circuit 412 to change the state of the select signal an each of the switches S1-S4. Thus, at the termination of the first period and beginning of the second period (as causes by the assertion of the output signal from comparator 413), the select signal changes state to cause multiplexer 418 to select the output of comparator 414, the closing of switches S2 and S3, and the opening of switches S1 and S4.

When switch S1 is open, C1 is decoupled from the current node. The closing of switch S3 forms the current path to ground in parallel with C1, causing its discharge. The opening of S4 terminates the discharging of C2, while the closing of S2 couples C2 to the current node. Accordingly, C2 begins charging at a rate dependent on the mount of current through the current node. The charging of C2 continues until the voltage across this capacitor reaches the level of Vref, at which time comparator 414 asserts its output signal. The assertion of the output signal by comparator 414 once again causes assertion of the Toggle signal, the incrementing of counter 410, and the changing of the state of the selection signal and each of the switches. Changing the state of the state of switches S1 through S4 re-activates the first circuit branch to begin charging C1, while the second branch is deactivated and C2 discharged.

The operation of current measurement circuit 100-2 is depicted in the state diagram shown in the upper right hand portion of FIG. 4. In a first state (corresponding to a first period), C1 is charging while C2 is discharging. In a second state (corresponding to a second period), C2 is charging while C1 is discharging. The states switch when the voltage on the currently charging capacitor reaches the voltage level of Vref. Each time the states switch, counter 410 is incremented. More particularly, when, V_C1 reaches the voltage level of Vref in the first state, the states switch to C1 discharging and C2 charging. When, V_C2 reaches the voltage level of Vref in the second state, the states switch to C2 discharging and C1 charging.

Current measurement circuit 100-2 further includes a timer 422, which can be used to periodically cause the count value of counter 410 to be output to digital storage circuit 215. Counter 410 may be allowed to accumulate a count value for a predetermined amount of time, which may be set as desired. After this predetermined amount of time has elapsed, timer 422 may assert the Transfer signal to cause the accumulated count value, Count, to be transferred to digital storage circuit 215. The count value transferred to digital storage circuit 215 in the embodiment shown is indicative of the average current over the predetermined amount of time in which the count value was allowed to accumulate. The current may be expressed by the following equation:

$$I_{Measured} = I_{sense\_gain} \times N_{trips} \left(\frac{1}{T}\right) \times V_{Ref} \times C_{acc}, \quad \text{(Equation 2)}$$

where T is the time period over which the count is allowed to accumulate before transfer to digital storage circuit 215 and $N_{trips}$ is the number of times the states switch during the time T.

Upon completing the transfer, timer 422 may assert the Reset signal to reset the counter. In this embodiment, generation of a digital value indicative of a measured current may occur at a speed that is based primarily on how fast the circuit can switch between states. Thereafter, circuitry such as a power management unit, a control circuit, a telemetry circuit, or other unit may access the digital value indicative of the current.

Alternative embodiments based on that which is shown in FIG. 4 are also possible and contemplated. For example, an embodiment is contemplated in which counter 410 sends a notification to timer 422 when it reaches half its count range. This could be used to reset counter 410 at approximately T/2 (rather than at T), which may prevent counter overflow. In another possible embodiment, an independent total accumulation timer could be used to read out the digital storage for the total measurement time. A local timer could be programmed to limit the count value of the local counter to avoid overflow based on, e.g., a highest expected average current possible. Generally speaking, the embodiment shown in FIG. 4 is flexible and may thus be implemented in different ways. Accordingly, the operation described above represents one possible embodiment, but is not intended to be limiting.

Figure 5:
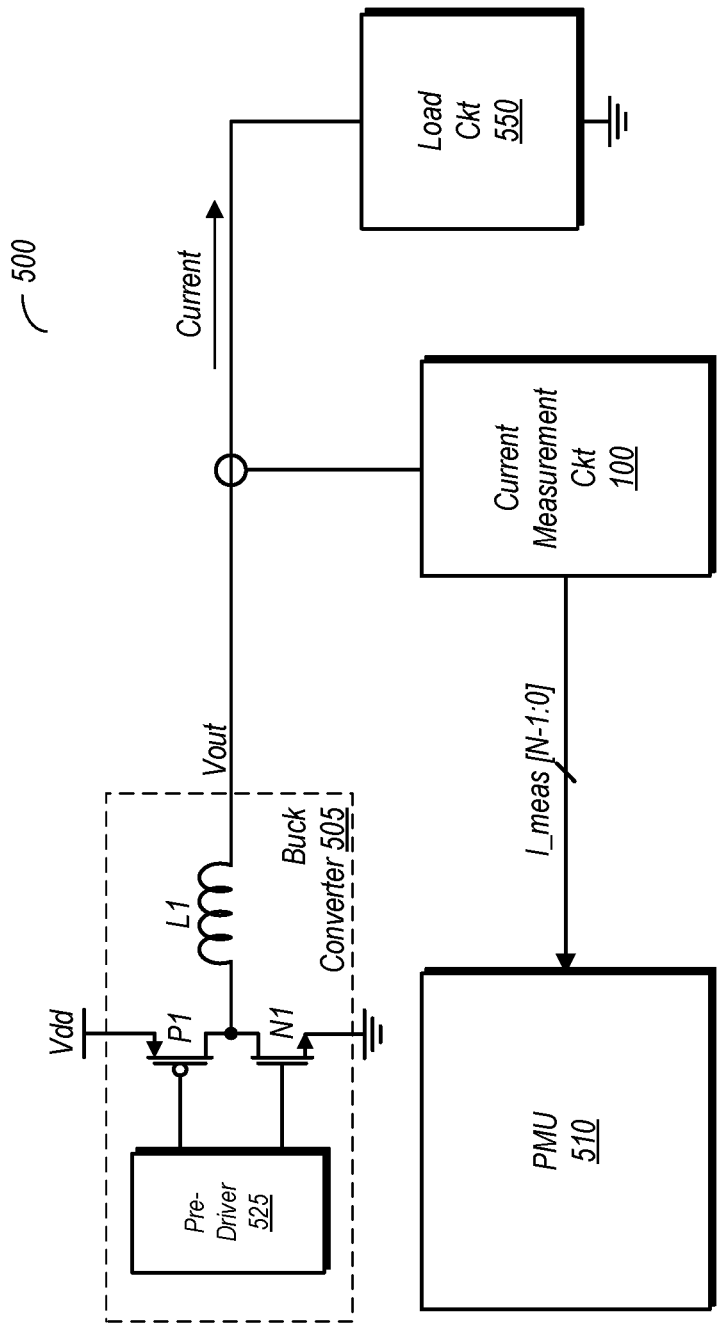
FIG. 5 a block diagram of one embodiment of a system including a buck converter, a current measurement circuit, and a power management unit.

FIG. 5 a block diagram of one embodiment of a system including a buck converter, a current measurement circuit, and a power management unit. It is noted that system 500 as shown in FIG. 5 represents but one application of current measurement circuit 100 among a number of different possibilities. Accordingly, FIG. 5 is intended to be illustrative, but not limiting.

In the embodiment shown, buck converter 505 includes a pre-driver circuit 525, a high side device P1 and a low side device N1. Pre-driver circuit 525 alternately switches these devices on and off such that the switching node coupled there between is either pulled up toward Vdd or down toward ground. The switching may be conducted in various modes of operation, such as pulse width modulation (PWM) or pulse frequency modulation (PFM). Although not explicitly shown here, pre-driver circuit 525 may be coupled to receive a reference voltage indicative of a desired output voltage to be provided by buck converter 505, and may also receive a feedback signal from a node in the circuit (e.g., the output node, Vout). An energy storage element, inductor L1, stores energy received from the switching node and smooths out the voltage that is provided on the output node. Thus, buck converter 505 may provide a regulated output voltage to load circuit 550. Load circuit 550 which may be virtually any type of circuit that operates using a regulated supply voltage, and can include, analog, digital, and/or mixed signal circuitry.

Current measurement circuit 100 may be any embodiment of a circuit for measuring current in accordance with this disclosure, including those discussed above. In this particular example, current measurement circuit 100 is coupled to the output node, Vout, of buck converter 505, and thus measures the output (load) current provided to load circuit 500. It is noted that embodiments are possible and contemplated wherein current measurement circuit 100 is coupled to the switching node (at the junction of P1 and N1). More generally, in various applications, current measurement circuit 100 may be coupled to measure the current through any suitable node of a circuit.

In the illustrated embodiment, current measurement circuit 100 is coupled to provide a digital value, I_meas [N–1:0], to a power management unit (PMU) 510. In various embodiments, PMU 510 may perform various power management functions within a system 500. For example, if load circuit 550 is one of a number of independently powered homogenous processor cores implemented on a system-on-a-chip (SoC) implemented on an integrated circuit, PMU 510 may use the current information to re-balance workloads when one processor core is drawing a significantly greater amount of current than others. PMU 510 may also include various types of telemetry functionality used to more generally monitor system parameters, including the current measured by current measurement circuit 510, as well as voltages, temperatures, and so on. Furthermore, if load circuit 550 is idle, PWM 510 may turn this circuit off by providing control signals to cause buck converter to discontinue operation. Using the current information provided by current measurement circuit may enable PWM 510 to verify that buck converter has truly discontinued operation.

Figure 6:
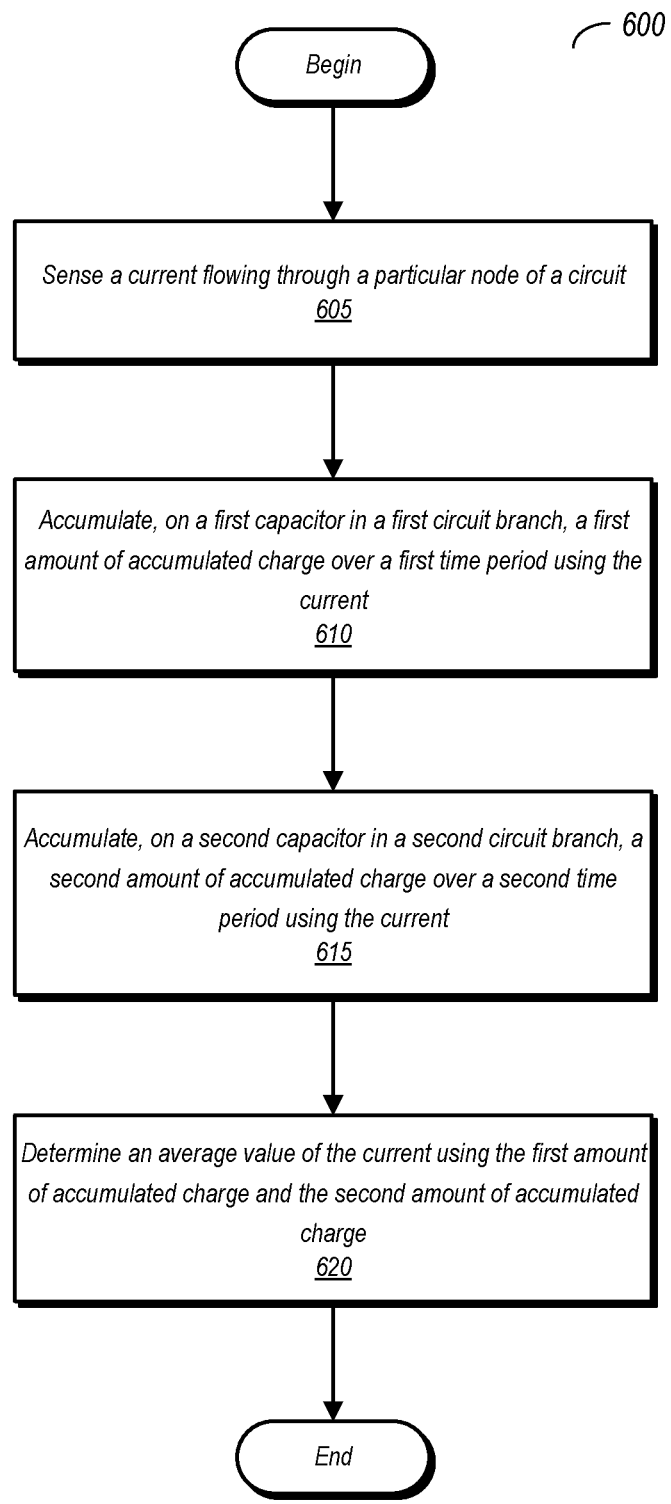
FIG. 6 if a flow diagram of one embodiment of a method for operating a current measurement circuit.

FIG. 6 if a flow diagram of one embodiment of a method for operating a current measurement circuit. Method 600 as shown here may be performed with various embodiments of a current measurement circuit as discussed above. Embodiments of a current measurement circuit not explicitly discussed herein but otherwise capable of carrying out Method 600 may fall within the scope of this disclosure. It is noted that a current measurement circuit capable of carrying out Method 600 may perform current measurements on a wide variety of other circuits, and is thus not limited to the examples provided in this disclosure.

Method 600 includes sensing a current flowing through a particular node of a circuit (block 605). The method further includes accumulating, on a first capacitor in a first circuit branch, a first amount of accumulated charge over a first period using the current (block 610), and subsequently accumulating, on a second capacitor in a second circuit branch, a second amount of accumulated charge over a second period using the current (block 615). Thereafter, the method includes determining an average value of the current using the first amount of accumulated charge and the second amount of accumulated charge (block 620).

In some embodiments, the respective durations of the first and second periods are fixed, and wherein respective durations of the first and second periods are equal to one another. In such embodiments, the method includes conveying, via a first switch, the first voltage to an analog-to-digital (ADC) and generating, based on the first voltage and using the ADC, a first digital value indicative of the current flowing through the node as measured during the first period. The method in such embodiments also includes conveying, via a second switch, the second voltage to the ADC and generating, based on the second voltage and using the ADC, a second digital value indicative of the current flowing through the node as measured during the second period. The method also includes storing the first and second digital values in a digital storage circuit coupled to the ADC.

In other embodiments, the first and second periods are variable, wherein a duration of the time period is dependent on a charging time of the first capacitor, and wherein a respective duration of the second period is dependent on a charging time of the second capacitor. In embodiments where the time periods are variable, the method includes the first capacitor charging, during the first period, to a value to at least a value equal to a reference voltage, and eventually, a first comparator outputting a first indication that the first capacitor has charged to the value at least equal to the reference voltage. In response to the first capacitor charging to at least the first value, the method further includes terminating the first period and beginning the second period in response to the first indication. After the first period is terminated, the second period begins the method includes the second capacitor charging, during the second period, to a value to at least a value equal to the reference voltage and a second comparator outputting a second indication that the second capacitor has charged to the value at least equal to the reference voltage. Upon the second capacitor charging to at least the reference voltage level, the method includes terminating the second period and beginning the first period of a next one of the plurality of cycles in response to the second indication.

Various embodiments includes discharging the first capacitor during the second period and discharging the second capacitor during the first period.

Figure 7:
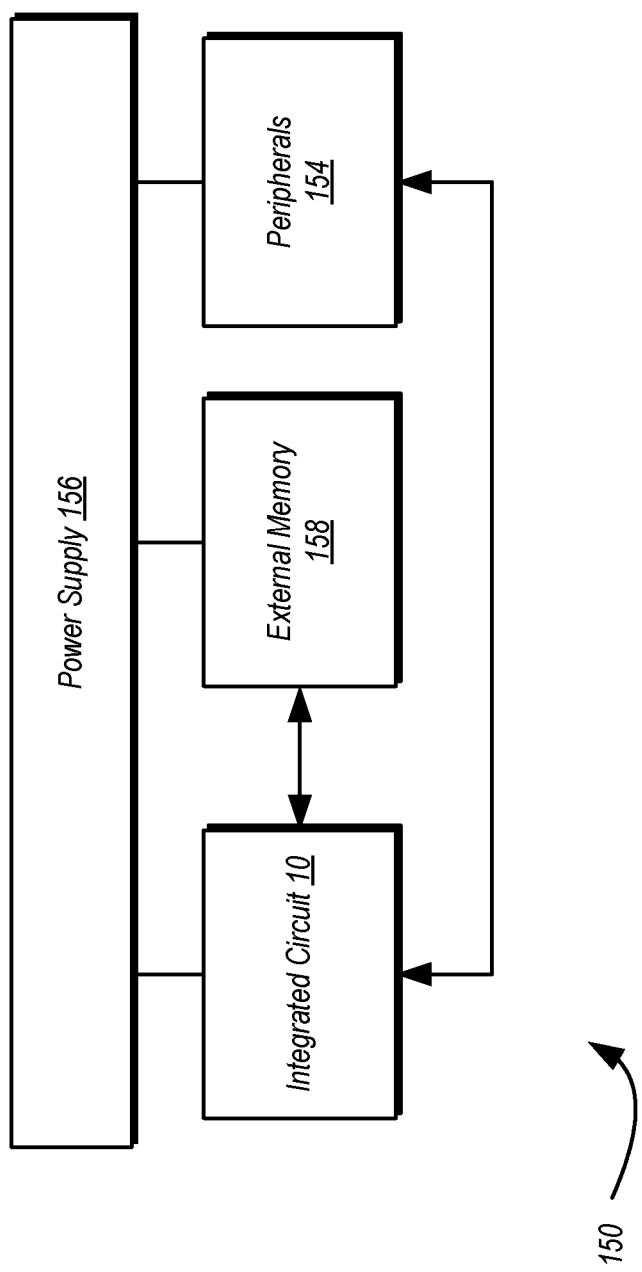
FIG. 7 is a block diagram of one embodiment of an example system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments, system 150 may include one or more instances of the various hardware/circuit embodiments discussed above. For example, IC 10 may include at least one instance of a buck converter having an embodiment of current measurement circuit 100 coupled thereto. More generally, circuitry coupled to carry out Method 600 as discussed above, including the various hardware/circuit embodiments disclosed herein, may be implemented in one or more instances in various ones of the components of system 150.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated, including the following: Claim 3 (could depend from any of claims 1-2); claim 4 (any preceding claim); claim 5 (claim 4), etc. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

Numerous variations and modifications will become apparent to those skilled in the art once the above disclosure is fully appreciated. It is intended that the following claims be interpreted to embrace all such variations and modifications.

What is claimed is:

1. A circuit comprising:
a power converter configured to generate a regulated supply voltage;
a current measurement circuit configured to measure an amount of current through an output node of the power converter, the current measurement circuit including:
a first circuit branch configured to convert the current as measured during a first period into a first voltage;
a second circuit branch configured to convert the current as measured during a second period into a second voltage;
an analog-to-digital converter (ADC) configured to generate corresponding digital values indicative of the current using the first and second voltages, wherein the ADC includes a first comparator configured to compare the first voltage to a reference voltage, a second comparator configured to compare the second voltage to the reference voltage, and a multiplexer configured to select an output of the first comparator during the first period and select an output of the second comparator during the second period; and
a control circuit configured to alternately couple one of the first and second circuit branches to the ADC.

2. The circuit as recited in claim 1, wherein respective durations of the first and second periods are variable.

3. The circuit as recited in claim 1, wherein the first circuit branch includes a first capacitor, wherein converting the current as measured during a first period into the first voltage includes charging the first capacitor using the current through the output node, and wherein the second circuit branch includes a second capacitor, wherein converting the current as measured during the second period into the second voltage includes charging the second capacitor using the current through the output node.

4. The circuit of claim 3, further comprising:
a first switch, wherein closing the first switch causes the first capacitor to charge during the first period;
a second switch, wherein closing the second switch causes the second capacitor to charge during the second period;
a third switch, wherein closing the third switch causes the first capacitor to discharge during a portion of the second period;
a fourth switch, wherein closing the fourth switch causes the second capacitor to discharge during a portion the first period.

5. The circuit of claim 4, further comprising:
a fifth switch configured to couple the first capacitor to the ADC; and
a sixth switch configured to couple the second capacitor to the ADC.

6. The circuit of claim 1, wherein the control circuit is configured to:
select the first circuit branch to cause a first capacitor to generate the first voltage during the first period;
cause a second capacitor to discharge during the first period;
cause the first voltage to be provided to the ADC;
select the second circuit branch to cause the second capacitor to generate the second voltage during the second period;
cause the first capacitor to discharge during the second period; and
cause the second voltage to be provided to the ADC.

7. The circuit of claim 1, further comprising a digital storage circuit coupled to an output of the ADC, wherein the digital storage circuit is configured to store digital values received from the ADC, wherein ones of the digital values correspond to an average current measured over a given period, and wherein the average current corresponds to a current through an inductor of a buck regulator.

8. The circuit of claim 1, further comprising:
a counter coupled to an output of the ADC, wherein counter is configured to increment a count value in response to assertion of an output signal from the multiplexer, wherein the output signal is based on an indication received from a selected one of the first and second comparators; and
a timer configured to periodically cause the count value to be output to a digital storage circuit and further configured to cause the counter to be reset.

9. A method comprising:
sensing a current flowing through a particular node of a circuit;
accumulating, on a first capacitor in a first circuit branch, a first amount of accumulated charge over a first period using the current;
accumulating, on a second capacitor in a second circuit branch, a second amount of accumulated charge over a second period using the current, wherein respective durations of the first and second periods are variable, wherein a duration of the first period is dependent on a charging time of the first capacitor, and wherein a respective duration of the second period is dependent on a charging time of the second capacitor; and
determining an average value of the current using the first amount of accumulated charge and the second amount of accumulated charge.

10. The method of claim 9, wherein respective durations of the first and second periods are fixed, and wherein respective durations of the first and second periods are equal to one another.

11. The method of claim 9, further comprising:
the first capacitor charging, during the first period, to a value to at least a value equal to a reference voltage;
a first comparator outputting a first indication that the first capacitor has charged to the value at least equal to the reference voltage;
terminating the first period and beginning the second period in response to the first indication;
the second capacitor charging, during the second period, to a value to at least a value equal to the reference voltage;
a second comparator outputting a second indication that the second capacitor has charged to the value at least equal to the reference voltage; and
terminating the second period and beginning the first period of a next one of a plurality of cycles in response to the second indication.

12. The method of claim 9, further comprising:
discharging the first capacitor during the second period; and
discharging the second capacitor during the first period.

13. The method of claim 9, further comprising:
conveying, via a first switch, a first voltage from the first capacitor to an analog-to-digital (ADC);
generating, based on the first voltage and using the ADC, a first digital value indicative of the current flowing through the node as measured during the first period;
conveying, via a second switch, a second voltage from the second capacitor to the ADC; and
generating, based on the second voltage and using the ADC, a second digital value indicative of the current flowing through the node as measured during the second period.

14. The method of claim 13, further comprising storing the first and second digital values in a digital storage circuit coupled to the ADC.

15. A system comprising:
a power converter circuit configured to generate a regulated supply voltage;
a current measurement circuit configured to measure a current through a current node of the power converter circuit, the current measurement circuit including:
a first capacitor implemented in a first circuit branch that further includes a first switch coupled between the first capacitor and the current node, wherein the first capacitor is configured to accumulate charge based on the current when the first switch is closed during a first period;
a second capacitor implemented in a second circuit branch that further includes a second switch coupled between the second capacitor and the current node, wherein the second capacitor is configured to accumulate charge based on the current when the second switch is closed during a second period;
an analog-to-digital converter (ADC) configured to generate digital values using a first voltage from the first capacitor and a second voltage from the second capacitor, wherein the ADC includes a first comparator configured to compare the first voltage to a reference voltage, a second comparator configured to compare the second voltage to the reference voltage, and a multiplexer configured to select an output of the first comparator during the first period and select an output of the second comparator during the second period; and
digital storage circuitry configured to store the digital values, the digital values indicating corresponding amounts of current flowing through the current node, respectively.

16. The system of claim 15, further comprising:
a third switch coupled between the first circuit branch and the ADC, wherein the third switch is closed to convey the first voltage to the ADC;
a fourth switch coupled between the second circuit branch and the ADC, wherein fourth switch is closed to convey the second voltage to the ADC;
a fifth switch coupled in parallel with the first capacitor wherein the fifth switch, when closed during the second period, provides a discharge path to a ground node for the first capacitor; and
a sixth switch coupled in parallel with the second capacitor, wherein the sixth switch, when closed during the first period, provides a discharge path to the ground node for the second capacitor.

17. The system of claim 15, wherein:
the first comparator is configured to assert a first indication causing termination of the first period in response to determining that a level of the first voltage is equal to or greater than the reference voltage; and
the second comparator is configured to assert a second indication causing termination of the second period in response to determining that a level of the second voltage is equal to or greater than the reference voltage.

18. The circuit of claim 15, further comprising a control circuit configured to:
cause the first switch to be closed during the first period and open during the second period;
cause the second switch to be closed during the second period and open during the first period;
cause the first capacitor to be discharged during the second period; and
cause the second capacitor to be discharged during the first period.

19. The system of claim 15, further comprising:
a counter coupled to an output of the ADC, wherein counter is configured to increment a count value in response to assertion of an output signal from the multiplexer, wherein the output signal is based on an indication received from a selected one of the first and second comparators; and a timer configured to periodically cause the count value to be output to the digital storage circuit and further configured to cause the counter to be reset.

20. The system of claim 19, further comprising a control circuit configured to cause a change of state of the first and second switches in response to assertion of the output signal from the multiplexer.

\* \* \* \* \*